(12) United States Patent
Fan

(10) Patent No.: US 7,503,770 B2
(45) Date of Patent: Mar. 17, 2009

(54) ELECTRICAL CONNECTOR

(75) Inventor: Chia-Wei Fan, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/821,303

(22) Filed: Jun. 22, 2007

(65) Prior Publication Data

US 2007/0298627 A1    Dec. 27, 2007

(30) Foreign Application Priority Data

Jun. 23, 2006   (CN) .......................... 2006 20074431

(51) Int. Cl.
*H01R 9/09* (2006.01)
(52) U.S. Cl. ...................................... 439/66
(58) Field of Classification Search .................. 439/66, 439/91, 591
See application file for complete search history.

(56) References Cited

U.S. PATENT DOCUMENTS

| | | | | |
|---|---|---|---|---|
| 4,664,458 A | * | 5/1987 | Worth .......................... | 439/82 |
| 5,324,205 A | * | 6/1994 | Ahmad et al. .................. | 439/66 |
| 5,380,210 A | * | 1/1995 | Grabbe et al. ................. | 439/66 |
| 5,655,913 A | * | 8/1997 | Castaneda et al. ............. | 439/66 |
| 6,447,304 B1 | * | 9/2002 | Korsunsky et al. ............. | 439/66 |
| 7,090,504 B2 | * | 8/2006 | Hou .............................. | 439/66 |
| 7,341,485 B2 | * | 3/2008 | Polnyi ......................... | 439/591 |
| 2007/0281501 A1 | * | 12/2007 | Ju ................................ | 439/66 |

* cited by examiner

Primary Examiner—Gary F. Paumen
(74) Attorney, Agent, or Firm—Wei Te Chung

(57) ABSTRACT

An electrical connector (1) comprises a housing (50) defining a plurality of passageways (502) thereof, each passageway (502) defining at least a pair of spaced retaining portion (5020) on inner walls thereof, a plurality of contacts (60) received in the passageways (50) comprising an anchoring portion (5020), a spring portion (601) extending from a top end thereof and a solder portion (603) extending from a distal end thereof, the anchoring portion (600) defines a narrower width than other portions of the contact for engaging with the retaining portions (5020) hence preventing the contact (60) from sliding from the passageways (502) therein.

12 Claims, 4 Drawing Sheets

ELECTRICAL CONNECTOR

BACKGROUND OF THE INVENTION

1. Field of the Invention

The present invention relates to the art of electrical connectors, and more particularly to a connector contact for connecting a chip module to a printed circuit board.

2. Description of the Related Art

Generally speaking, a connector to which this invention is applicable is interposed between first and second electronic parts or components having contact pads, respectively, to achieve electrical connection between the first and the second electronic components. In the following description, the first and the second electronic components are a printed board and an LSI circuit, respectively.

Referring to FIGS. 1-4, a conventional connector, referring to No. U.S. Pat. 6,447,304, comprises a housing 10, a plurality of contacts 20 received in the housing 10.

Referring to FIGS. 1 and 2, each contact 20 is formed by punching and bending an elastic metal plate so that each contact 20 comprises a generally U-shaped portion comprising a first leg portion 21, a second leg portion 22 and a bridge portion 23 connecting the first and the second leg portions 21 and 22, and an extension portion 24 from obliquely extending an end 21a of the first leg portion 21 downwardly. The first leg portion 21 has the lower end 21a and a bent depression 21b above and adjacent the lower end 21a. The second leg portion 22 has a widened end 22a. The extension portion 24 has a curved end portion 24a as an extended lower end portion and a first contact point 24b formed on the curved end portion 24a to be brought into contact with the contact pad of the printed board 100. The bridge portion 23 has a second contact point 23a on its top portion to be brought into contact with the contact pad of the LSI circuit 200.

The holding effect of the contact by the wall surface is achieved because the contact 20 having a dimension a (FIG. 2) in a free state and having an elasticity is press-fitted into the contact receptacle hole 11 having a dimension A (FIG. 3) smaller than the dimension a. In addition, the holding portion 11a is inserted into the bent depression 21b, while the widened end 22a of a special shape is engaged with step portions at the holding portion 11b in the contact receptacle hole 11, as illustrated in FIG. 4.

Referring to FIGS. 3 and 4, the contact 20 is inserted into each of the contact receptacle holes 11 of the insulator 10 and held at a predetermined position. In this state, the first and the second leg portions 21 and 22 are held by an inner wall surface of the contact receptacle hole 11. Specifically, the end portion of the first leg portion 21 including the lower end 21a and the bent depression 21b and the end portion of the second leg portion 22 including the widened end 22a are respectively held by holding portions 11a and 11b each of which is a part of the inner wall surface defining the contact receptacle hole 11. The end portions of the first and the second leg portions 21 and 22 may be referred to as supported portions.

As seen from FIG. 3, the contact receptacle hole 11 of the insulator 10 has a cavity 11c and a depression 11d. The cavity 11c should be understood as a recess formed in a lower surface of the insulator 10 to allow elastic deformation of the extension portion 24 of the contact 20 inserted into the contact receptacle hole 11. Likewise, the depression 11d should be understood as a recess formed in the inner wall of the contact receptacle hole 11 to allow elastic deformation of the first and the second leg portions 21 and 22 together with the bridge portion 23 of the contact 20 inserted into the contact receptacle hole 11.

A problem, however, with using the connector contact 20 is that, the connector contact 20 may be subjected to premature fatigue at the leg portions 21, 22 after depressing for many times. This is prone to produce a loose engagement between the contact 20 and the contact receptacle hole 102 result in contact 20 is easy to escape from the contact receptacle hole 11.

SUMMARY OF THE INVENTION

An electrical connector according to an embodiment of the present invention is provided to include a housing, a plurality of contacts received in the housing, wherein the housing defines a number of spaced retaining portions and each contact defines an anchoring portion with a narrower width for engaging with the retaining portions of the housing. As compared with the prior art, the engagement between the housing and the contact becomes more reliable and stable hence preventing the contact from sliding off.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
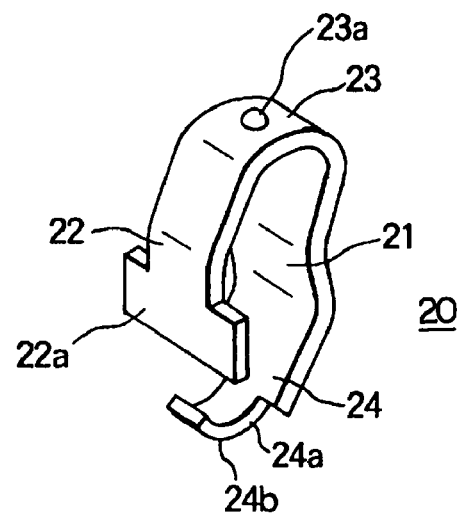
FIG. 1 is a perspective view of a conventional contact.
Figure 2:
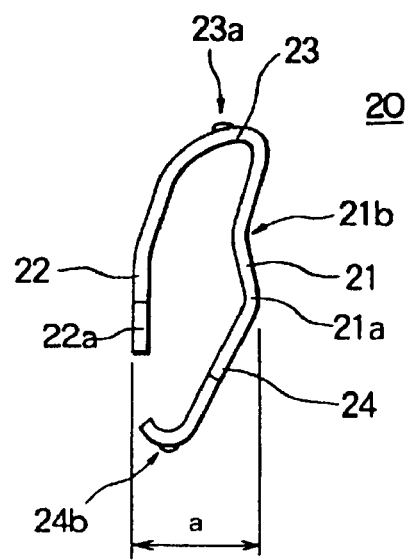
FIG. 2 is a side view of the contact of FIG. 1.
Figure 3:
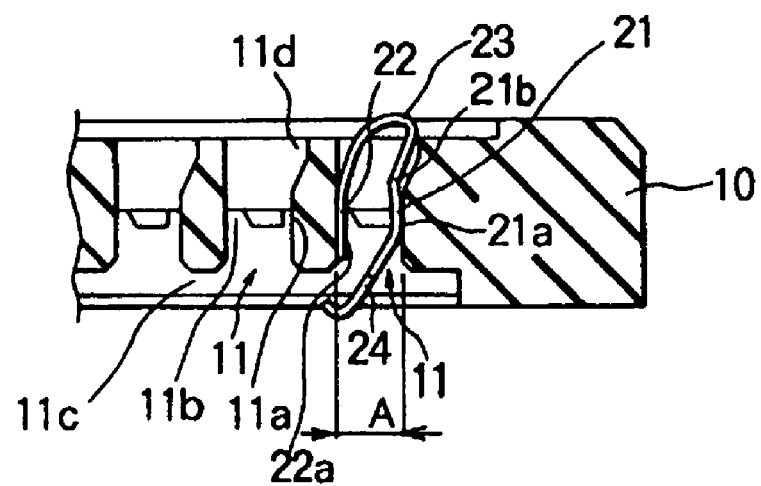
FIG. 3 is a cross-sectional view of the contact of FIG. 1 received in a housing.
Figure 4:
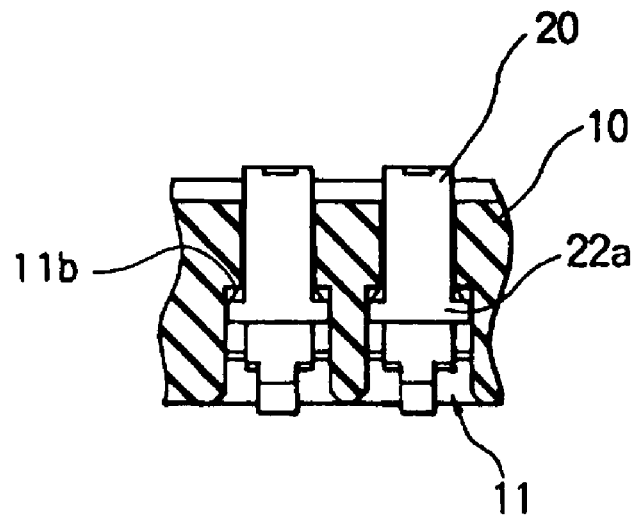
FIG. 4 is a cross-sectional view of the contact of FIG. 1 received in a housing, from another perspective.
Figure 5:
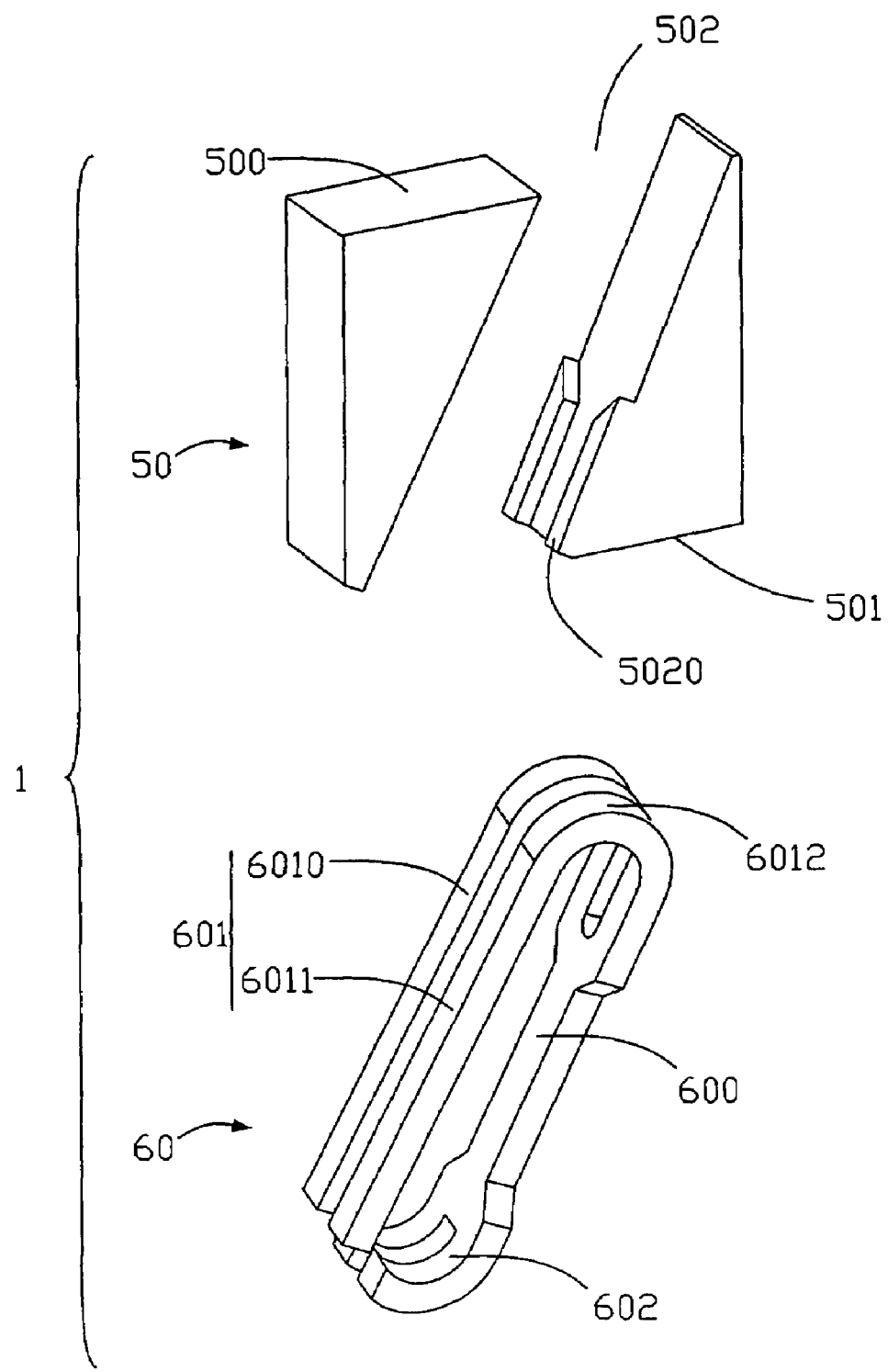
FIG. 5 is an exploded view of an electrical connector contact in accordance with a preferred embodiment of the invention.
Figure 6:
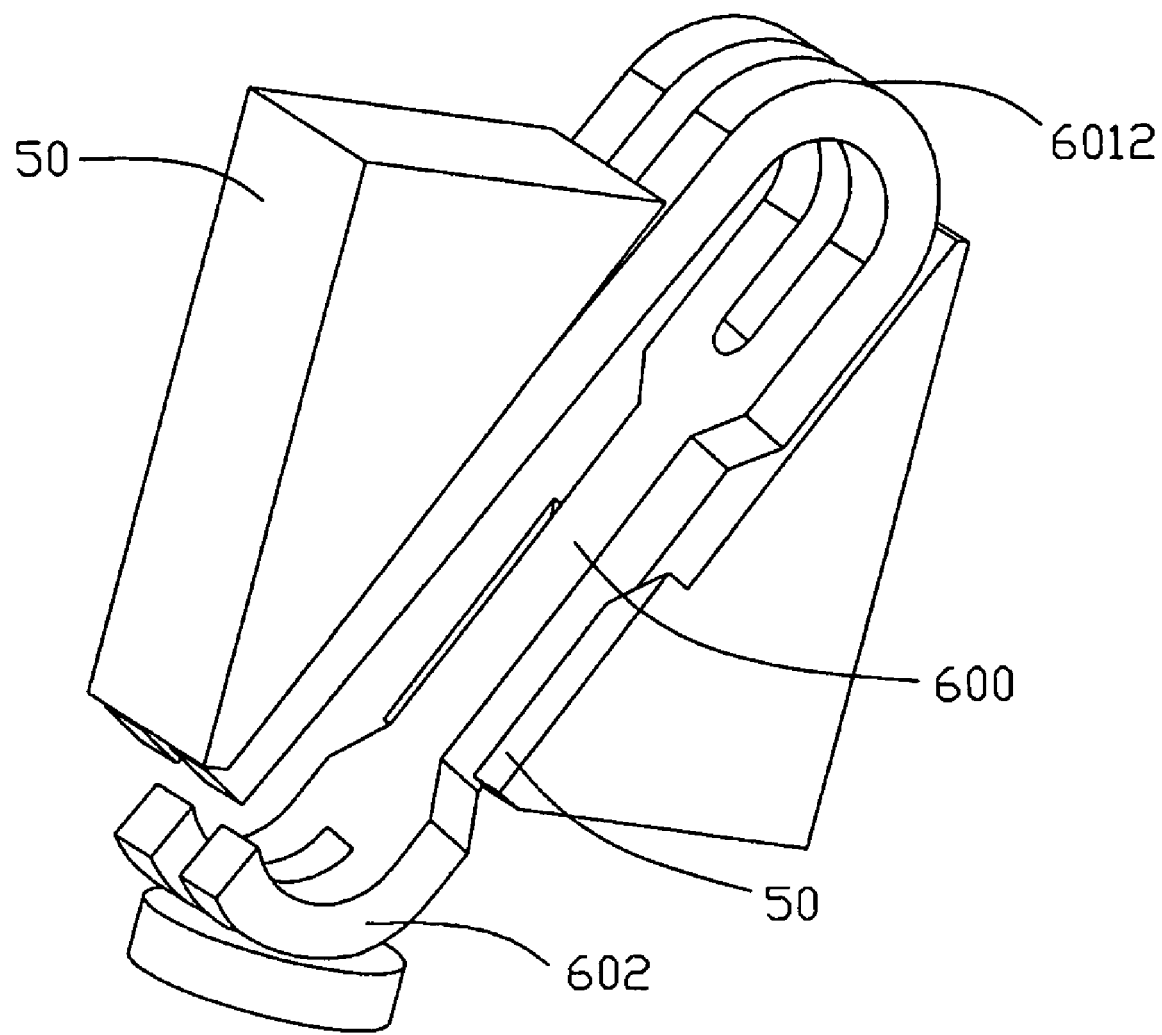
FIG. 6 is an assembled view of the electrical connector shown in FIG. 5.

Referring to FIGS. 1 and 5, an electrical connector 1 in accordance with the present invention includes a housing 50 defining at least a passageway 502 extending between first and second surfaces 500, 501. A plurality of contacts 60 is arranged within the passageways 502.

The electrical connector 1 is arranged between first and second substrates. And according to the preferred embodiment, the first substrate is a motherboard having at least a conductive pad thereon, while the second substrate is a CPU having a plurality of conductive pads thereon.

The housing 50 defines an upper surface 500 facing the chip module and a bottom surface 501 facing the printed circuit board, and a plurality of passageways 502 for receiving the contacts 60 therein. Each passageway 502 defines a pair of spaced retaining portion 5020 extending from inner walls thereof for engaging with the contact 60.

The contact 60 includes an anchoring arm 600, and a spring arm 601 extending from an upper end of the anchoring arm 600 and a solder portion 602 extending from a distal end thereof. The spring arm 601 comprises a first U-shaped portion 6010 and a second U-shaped portion 6011 parallel to the first U-shaped portion 6010. The first U-shaped portion 6010 and the second U-shaped portion 6011 define a contacting portion 6012 respectively for engaging with corresponding conductive pads of the chip module. Additionally, the cross section of the anchoring portion 600 is smaller than the cross section of the solder portion 602 or the elastic portion 601 for engaging with the retaining portions 5020 of the housing 50. The solder portion 602 extends slantly from a distal end of the anchoring portion 600 forming at least two solder points for engaging with a same conducting pad of the printed circuit board.

When the contacts 60 are inserted into passageways 502 of the housing 50, the U-shaped portion 6012 is firstly pressed for inserting through the space formed between the retaining portions 5010 of the passageways 502 and then restore to a start state. At this time, the anchoring portion 600 of the contact 60 is received in the space formed between the retaining portions 5020, and the cross section of the solder portion 602 is disposed wider than the space so that the contact 60 is secured in the passageway 502 of the housing 50, which prevents contact 60 from sliding off.

The contact 60 of the electrical connector 1 defines an anchoring portion 600 with a narrower cross section for engaging with the retaining portions 5020 formed on inner walls of passageways, which provides a secured connection between the contacts and the housing.

It must be pointed out that the shape of the retaining portion 5020 defined on the passageways can be altered from real situation with only one principle that can be engaged with the structure of the anchoring portion 600.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector, comprising:
   a base defining a plurality of passageways slantly arranged between a mating interface and mounting face;
   each passageway defining at least an inner wall in which a retaining portion is formed, the retaining portion comprises at least a pair of retaining portions;
   a plurality of contacts each slidably assembled into the passageway, and comprise at least one anchoring portion with a narrower width for engaging with a space formed between the retaining portions, the retaining portion precludes the contact from escaping from the passageway.

2. The electrical connector as recited in claim 1, wherein the contact further comprises a solder portion extending from a lower end of the anchoring portion and a spring portion extending from a top end of the contact, and width of the anchoring portion is narrower than either of the solder portion and the spring portion.

3. The electrical connector as recited in claim 2, wherein the spring portion comprises a first arm portion and a second arm portion parallel to the first arm portion.

4. The electrical connector as recited in claim 3, wherein the first arm portion and the second arm portion each define an U-shaped portion for contacting with the chip module.

5. The electrical connector as recited in claim 2, wherein the solder portion defines a pair of solder tails for engaging with a same conducting pad of the printed circuit board.

6. The electrical connector as claimed in claim 1, wherein the narrowed portion can move along the retaining portion.

7. An electrical connector comprising:
   a housing defining a plurality of passageways thereof each passageway defining at least a pair of spaced retaining portion on inner walls thereof;
   a plurality of contacts received in the passageways comprising an anchoring portion, a spring portion extending from a top end thereof and a solder portion extending from a distal end thereof;
   wherein the anchoring portion defines a narrower portion than other portions of the contact, the narrower portion can move along the retaining portions and is restrained between the retaining portions for preventing the contact from escaping from the passageways.

8. The electrical connector as recited in claim 7, wherein the contact further includes a solder portion which cooperates with the narrower portion to commonly define another stop portion engaged with the retaining portion, hence preventing the contact from escaping from the passageway.

9. An electrical connector comprising:
   an insulative housing defining a plurality of oblique passageways in matrix, each of said passageways defining an oblique upper inner wall face and an oblique lower inner wall face opposite to each other;
   a plurality of contacts disposed in the corresponding passageways, respectively, each of said contacts defining an oblique upper arm compliantly intimately seated upon and abutting against the upper inner wall and an oblique lower arm compliantly and intimately seated upon and abutting against the lower inner wall; wherein
   one of said upper inner wall and said lower inner wall has a first retention device, and one of said upper arm and said lower arm corresponding to said one of said upper inner wall and said lower inner wall, has a second retention device under a condition that the first retention device confronts and is adapted to abut against the second retention device along an oblique direction defined by said corresponding passageway.

10. The electrical connector as claimed in claim 9, wherein the first retention device is formed on the lower inner wall face, and the second retention device is formed the lower arm.

11. The electrical connector as claimed in claim 10, wherein said first device is a protrusion, and the second retention is a recess.

12. The electrical connector as claimed in claim 9, wherein said first device is a protrusion, and the second retention is a recess.

* * * * *